(12) United States Patent
Apel

(10) Patent No.: US 7,382,194 B2
(45) Date of Patent: Jun. 3, 2008

(54) SWITCHED DISTRIBUTED POWER AMPLIFIER

(75) Inventor: Thomas R. Apel, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 11/335,340

(22) Filed: Jan. 18, 2006

(65) Prior Publication Data

US 2007/0176677 A1 Aug. 2, 2007

(51) Int. Cl.
*H03F 3/68* (2006.01)

(52) U.S. Cl. .................... 330/295; 330/124 R

(58) Field of Classification Search .......... 330/295, 330/124 R, 84, 126; 455/126
See application file for complete search history.

(56) References Cited

U.S. PATENT DOCUMENTS

| | | | |
|---|---|---|---|
| 5,162,756 A | 11/1992 | Taniguchi et al. | |
| 5,541,554 A | 7/1996 | Stengel et al. | |
| 5,629,648 A * | 5/1997 | Pratt | 330/289 |
| 5,880,633 A | 3/1999 | Leizerovich et al. | |
| 5,886,575 A | 3/1999 | Long | |
| 6,137,355 A | 10/2000 | Sevic et al. | |
| 6,262,629 B1 | 7/2001 | Stengel et al. | |
| 6,329,877 B1 | 12/2001 | Bowen et al. | |
| 6,359,514 B1 | 3/2002 | King et al. | |
| 6,374,092 B1 | 4/2002 | Leizerovich et al. | |
| 6,617,929 B2 | 9/2003 | Kim et al. | |
| 7,123,096 B2 * | 10/2006 | Selin | 330/295 |
| 7,227,418 B2 * | 6/2007 | Makioka | 330/295 |
| 2002/0093383 A1 | 7/2002 | Thompson | |
| 2002/0132652 A1 | 9/2002 | Steel et al. | |
| 2002/0135425 A1 | 9/2002 | Kim et al. | |
| 2002/0190790 A1 | 12/2002 | Cheng et al. | |

\* cited by examiner

*Primary Examiner*—Henry Choe
(74) *Attorney, Agent, or Firm*—Bever Hoffman & Harms

(57) ABSTRACT

A switched distributed power amplifier includes an amplifier stage that includes a first amplifier subsection and a second amplifier subsection, both including one or more field effect transistors (FETs). Each FET in the first amplifier subsection is coupled to a radio frequency (RF) input terminal. Each FET in the second amplifier subsection is coupled to the RF input terminal through an input delay element, which includes a first inductor, a first capacitance associated with gates of the FETs in the first amplifier subsection, a second capacitance associated with gates of the FETs in the second amplifier subsection, and a third capacitance associated with a capacitor coupled to the RF input terminal. The input delay element is designed such that the sum of the first and third capacitances is equal to the second capacitance. A shunt switch prevents the second amplifier subsection from turning on during a low power mode.

23 Claims, 3 Drawing Sheets

SWITCHED DISTRIBUTED POWER AMPLIFIER

FIELD OF THE INVENTION

The present invention relates to a power amplifier. More specifically, the present invention relates to a linear power amplifier that provides the advantages of a distributed power amplifier and a mode switched amplifier.

RELATED ART

FIG. 1 is a block diagram of a conventional distributed amplifier 100, which includes an input transmission line 102, an output transmission line 104, a plurality of equalizing transmission lines 106$i$ (i=1 to N), a plurality of field effect transistor (FET) devices 108$i$ (i=1 to N), an input transmission line terminating impedance 110 and an output line terminating impedance 112. Distributed amplifier 100 is also known as a "traveling wave amplifier".

Each of FET devices 108$i$ includes a gate-to-source capacitance and a drain-to-source capacitance. Each of FET devices 108$i$ couples input transmission line 102 to output transmission line 104. FET devices 108$i$ are spaced uniformly along these transmission lines 102 and 104, with the gates of FET devices 108$i$ being coupled to input transmission line 102, the drains of FET devices 108$i$ being coupled to output transmission line 104 and the sources of FET devices 108$i$ being connected to ground. The gate-to-source capacitances of FET devices 108$i$ periodically load input transmission line 102 while the drain-to-source capacitances of FET devices 108$i$ periodically load output transmission line 104. The drain-to-source capacitances of FET devices 108$i$ are not always sufficient to equalize the characteristic impedances and velocities of the transmission lines 102 and 104. Therefore, equalizing transmission lines 106$i$ are sometimes put in series with the drain-to-source capacitances.

It is well known to model transmission lines as a cascade of periodic series inductances and shunt capacitances. Thus, the input transmission line 102 includes input inductances 114$i$ (i=1 to N), which are associated with the gate-to-source capacitances of FET devices 108$i$. Similarly, output transmission line 104 includes output inductances 116$i$ (i=1 to N), which are associated with the drain-to-source capacitances of FET devices 108$i$.

Input inductances 114$i$ and the associated gate-to-source capacitances of FET devices 108$i$ form a gate line. This gate line represents a series of delay lines, which provide phase staggered drive signals to the gates of the constituent FET devices 108$i$. Output inductances 106$i$ are connected to form a drain network, which couples the drains of FET devices 108$i$ to the output terminal. The drain network must be designed to match the delays introduced by the gate line, such that the signals provided at the drains of FET devices 108$i$ are phase matched to provide the output signal.

Output transmission line 104 exhibits a lumped constant impedance. The drain voltages of transistors $108_1$, to $108_N$ successively increase, with transistor $108_1$, having the lowest drain voltage, and transistor $108_N$ having the highest drain voltage. However, each of transistors $108_1$, to $108_N$ injects the same current to the output terminal. Moreover, each of transistors $108_1$, to $108_N$ drives a different load impedance, based on the position of the transistor along the transmission line. Consequently, at best, one of transistors $108_1$, to $108_N$ is driving an optimal load impedance. As a result, the power supplied by distributed amplifier 100 is severely limited. For example, the power supplied by distributed amplifier 100 may be limited by the supply voltage. Consequently, large inductors (not shown) have been used to supply a boosted drain voltage to transistors $108_1$, to $108_N$. However, such inductors are required to carry large currents, which necessitate wide metallization lines, and result in large parasitic line capacitance. This large parasitic line capacitance renders distributed amplifier 100 impractical for use in wideband power amplifier applications.

Conventional handset power amplifiers often use heterojunction bipolar transistors (HBTs). FIG. 2 is a circuit diagram of an advanced, mode switched, power amplifier 200, which includes an amplifier circuit 210 that implements HBTs 210A and 210B. Power amplifier 200 also includes input terminal 201, intermediate node 202, output terminal 203, bias resistors 211-212, bias control circuit 215, impedance match circuit 220, input delay element 230 and impedance inverting delay element 240. Input delay element 230 includes inductor 231 and capacitors 232-233. Impedance inverting delay element 240 includes inductor 241 and capacitors 242-243.

A radio frequency input signal $R_{IN}$ applied to input terminal 201 is routed to the base of HBT 210A as an RF input signal, $R_1$. In parallel, the $R_{IN}$ signal is routed to the base of HBT 210B as an RF input signal, $R_2$. Because the $R_2$ signal must pass through input delay element 230, the $R_2$ signal is delayed with respect to the $R_1$ signal.

Power amplifier 200 is capable of operating efficiently in a low power mode or a high power mode. In the low power mode, bias control circuit 215 activates the $BIAS_1$ signal and deactivates the $BIAS_2$ signal, thereby enabling HBT 210A and disabling HBT 210B. In response, HBT 210A provides an output signal $R_3$ to impedance inverting delay element 240, thereby causing this element 240 to provide an output signal $R_5$. Because HBT 210B is disabled, the output signal $R_5$ is simply routed to output terminal 202 as the $R_{out}$ signal.

In the high power mode, bias control circuit 215 activates the $BIAS_1$ and $BIAS_2$ signals, thereby enabling HBTs 210A and 210B. In response, HBTs 210A and 210B provide output signals $R_3$ and $R_4$, respectively. The delay introduced by impedance inverting delay element 240 is equal to the delay introduced by input delay element 230, thereby causing the $R_4$ signal to be in phase with the $R_5$ signal. Consequently, the $R_4$ and $R_5$ signals are effectively added at intermediate node 202, thereby creating an amplified RF output signal $R_{out}$, which is provided to output terminal 203.

The configuration of power amplifier circuit 200 provides an optimized load impedance in the high power mode, and an improved load impedance in the low power mode.

However, power amplifier 200 undesirably requires impedance matching circuit 220 at the input of amplifier circuit 210. Impedance matching circuit 220 requires a pair of dedicated inductors and a pair of dedicated capacitors, thereby complicating the fabrication of power amplifier 200.

It would therefore be desirable to meet the input delay requirements of power amplifier 200, while substantially reducing the required number of inductors and capacitors. It would also be desirable to have a mode switched power amplifier that provides proper impedance matching circuit at the input of the amplifier circuit.

DETAILED DESCRIPTION

Figure 1:
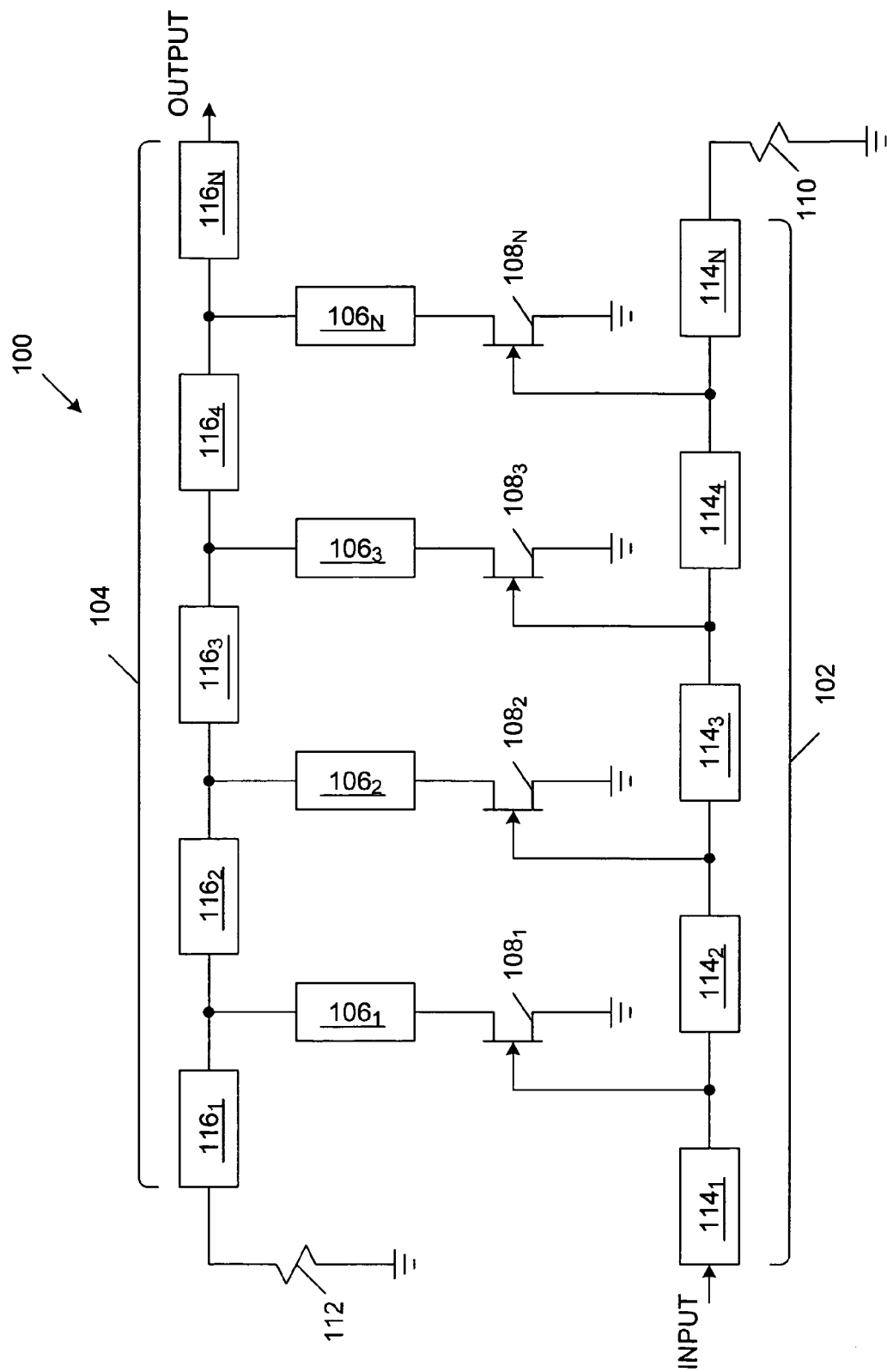
FIG. 1 is a circuit diagram of a conventional distributed amplifier.

Skilled artisans will understand that certain well-known electronic circuit features (e.g., power supply lines) have been omitted so as to more clearly illustrate embodiments of the invention. Like-numbered elements in the drawings refer to the same or substantially similar elements among the various embodiments. For example, embodiments are generally described in terms of enhancement mode pseudomorphic-high-electron-mobility transistor (pHEMT) field effect transistors (FETs). However, skilled artisans will understand that other field effect transistor (FET) technology can be adapted to the disclosed circuit topologies. Some embodiments are formed on a gallium arsenide (GaAs) substrate using conventional GaAs fabrication. Other semiconductor materials (e.g., silicon, indium phosphide) may be used in other embodiments.

In accordance with one embodiment of the present invention, the input delay requirements of power amplifier 200 (FIG. 2) are met with a FET distributed amplifier input structure, with the advantage that the number of inductors and capacitors can be substantially reduced.

As described in more detail below, the present invention provides a switched distributed power amplifier that implements field effect transistors, such as enhancement mode pHEMT transistors. Enhancement mode pHEMT transistors exhibit low threshold voltages and low pinch-off voltages. More specifically, enhancement mode pHEMT transistors turn on in response to control voltages equal to or greater than a few tenths of a Volt. Consequently, it is possible for enhancement mode pHEMT transistors to turn on (e.g., be driven up in a Class B operating mode) in response to an RF input signal, even if the associated DC bias signal is in a state that is intended to turn off the enhancement mode pHEMT transistors. As described below, the switched distributed power amplifier of the present invention overcomes this problem to allow the use enhancement mode pHEMT transistors.

The switched distributed power amplifier of the present invention includes a low power amplifier subsection and a high power amplifier subsection, both of which implement one or more parallel connected field effect transistors. Within the low power amplifier subsection, the gates of the field effect transistors are coupled to receive an RF input signal (through a DC blocking capacitor). Within the high power amplifier subsection, the gates of the field effect transistors are coupled to receive the RF input signal through an input delay element. The input delay element is designed to incorporate the gate capacitance of the low power amplifier subsection and the gate capacitance of the high power amplifier subsection, thereby simplifying the design of the advanced, mode switched, power amplifier. This is a feature of the distributed input approach.

During low power operation, a shunt switch is enabled to provide a DC and AC path from ground to the gates of the field effect transistors in the high power amplifier subsection, thereby disabling the high power amplifier subsection. The enabled shunt switch thereby ensures that the high power amplifier subsection is not turned on in response to a high level RF input signal. A first load resistance can be added along the DC and AC path to provide a desired loading during the low power mode.

Figure 2:
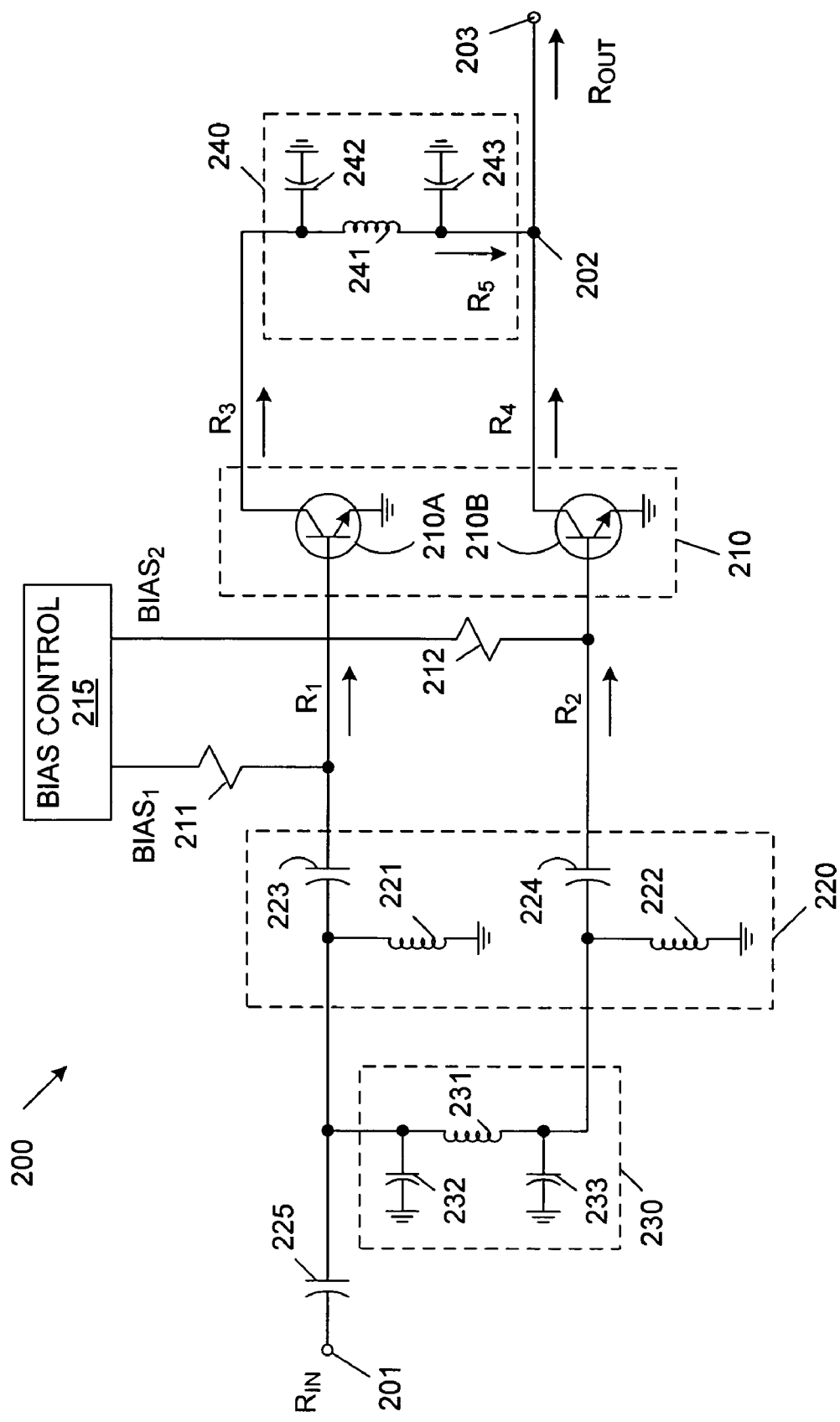
FIG. 2 is a circuit diagram of an advanced, mode switched, power amplifier.

During high power operation, the shunt switch is disabled to allow a DC bias signal to be applied to the gates of the field effect transistors in the high power amplifier subsection, thereby enabling the high power amplifier subsection. When the shunt switch is disabled, the RF load impedance is raised to allow signal voltages to drive the gates of the high power amplifier subsection 312. Significantly, the switched distributed power amplifier of the present invention does not require the impedance matching inductors or capacitors required by power amplifier 200 (FIG. 2).

Figure 3:
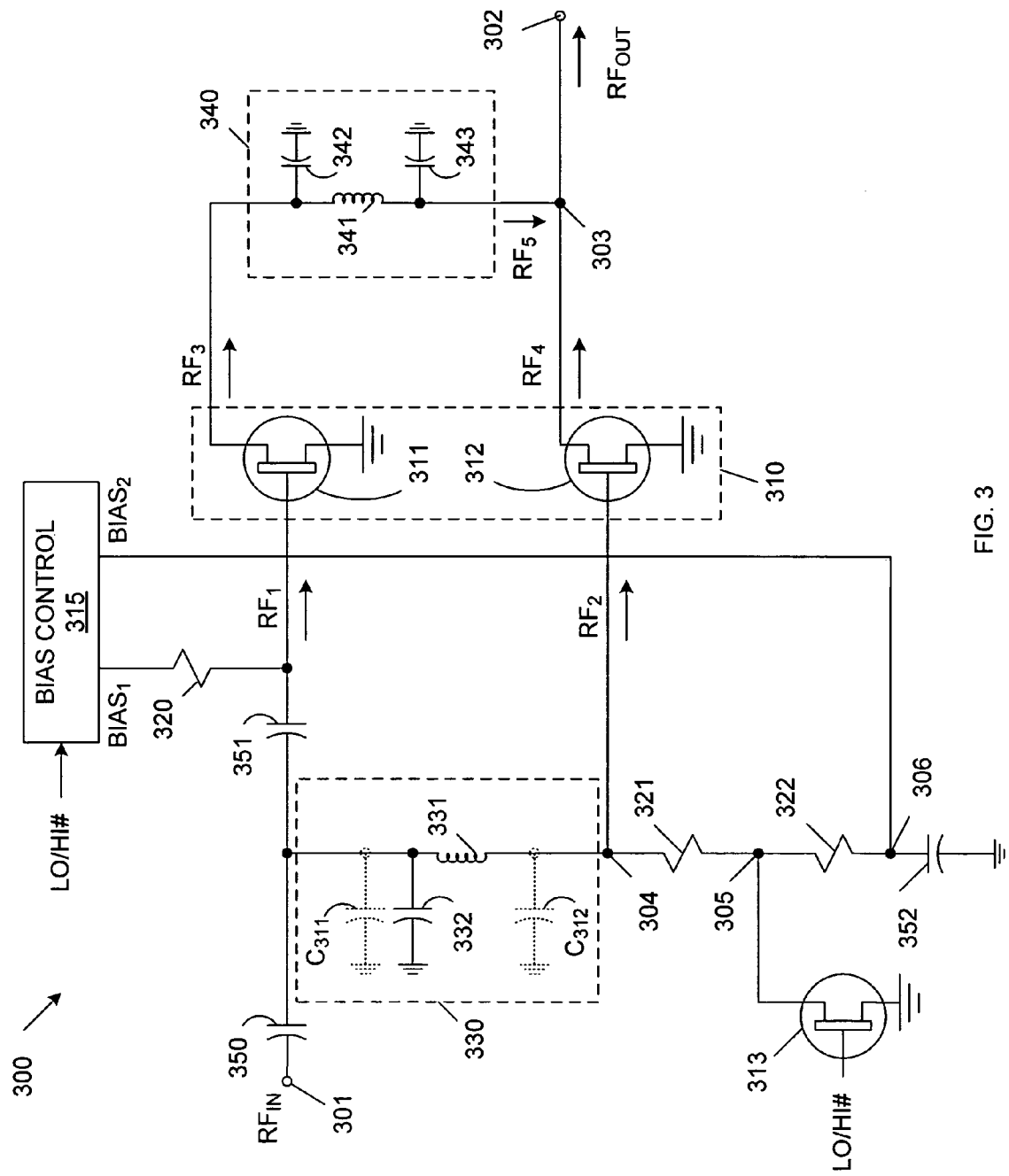
FIG. 3 is a circuit diagram of a switched distributed power amplifier in accordance with one embodiment of the present invention.

FIG. 3 is a circuit diagram of a switched distributed power amplifier 300 in accordance with one embodiment of the present invention. Switched distributed power amplifier circuit 300 includes input terminal 301, output terminal 302, internal nodes 303-306, switched amplifier stage 310, shunt switch 313, bias control circuit 315, resistors 320-322, input delay element 330, impedance inverting delay element 340 and capacitors 350-352.

As shown in the embodiment of FIG. 3, switched amplifier stage 310 includes two amplifier subsections 311 and 312. Note that amplifier subsections 311 and 312 are illustrative. Three or more amplifier subsections may be used in stage 310, with each subsection receiving a corresponding bias signal from bias control circuit 315. Amplifier subsections 311 and 312 are illustratively shown as enhancement-mode pHEMT field effect transistors. In other embodiments, other types of field effect transistor types can be used. It is important that such transistors exhibit a low loss gate capacitance, for reasons that will become apparent in view of the following description. In the described embodiment, the enhancement-mode pHEMT field effect transistors are formed using conventional gallium arsenide fabrication methods.

Each of amplifier subsections 311 and 312 may be formed of a single field effect transistor, or may include multiple field effect transistors coupled to provide an equivalent larger transistor. In addition, other embodiments may use more than a single switched amplifier stage.

As shown in FIG. 3, a radio frequency input signal $RF_{IN}$ is provided to input terminal 301 by a signal source (not shown). In some instances, $RF_{IN}$ is a signal processed to carry information in accordance with conventional Time Division Multiple Access (TDMA), Code Division Multiple Access (CDMA), Wideband CDMA (WCDMA), or Enhanced Data GSM (Global System for Mobile Communication) Environment (EDGE) processing. These signal processing methods are illustrative of modulation modes used to encode or distribute information in a signal, and for which linear amplifier operation is required. Input signal $RF_{IN}$ is illustratively in the 800 MegaHertz (MHz) or 1.9 GHz cellular telephony frequency ranges. Capacitor 350 operates as a series DC blocking capacitor on the RF input line.

The $RF_{IN}$ signal is routed from input terminal 301 to the gate(s) of amplifier subsection 311 through capacitor 351. Capacitor 351 is a relatively large capacitor (e.g., 20 pF) that operates as an AC short circuit and a DC open circuit (block). The $RF_{IN}$ signal is also routed from input terminal 301 to the gate(s) of amplifier subsection 312 through input delay element 330. As a result, amplifier subsection 312 receives a delayed version of the $RF_{IN}$ signal (compared to the version of the $RF_{IN}$ signal received by amplifier subsection 311). The RF signals received at the gates of amplifier subsections 311 and 312 are labeled as signals $RF_1$, and $RF_2$, respectively. Thus, the $RF_2$ signal is a delayed version of the $RF_1$ signal.

Note that input delay element 330 includes an inductor 331 and a capacitor 332. In addition, the gate-to-source capacitance ($C_{311}$) of amplifier subsection 311 is seen on input terminal 301. Consequently, this capacitance $C_{311}$ is illustrated in dashed lines within input delay element 330. Similarly, the gate-to-source capacitance ($C_{312}$) of amplifier subsection 312 is seen on internal node 304, and is illustrated in dashed lines within input delay element 330.

As described in more detail below, amplifier subsection 312 is larger than amplifier subsection 311. That is, amplifier subsection 312 includes more and/or larger field effect transistors than amplifier subsection 311. As a result, the gate-to-source capacitance $C_{312}$ of amplifier subsection 312 is greater than the gate-to-source capacitance $C_{311}$ of amplifier subsection 311. Capacitor 332 is selected to have a capacitance ($C_{332}$) that is equal to the difference between the gate-to-source capacitance $C_{312}$ and the gate-to-source capacitance $C_{311}$. (i.e., $C_{332}=C_{312}-C_{311}$). Stated another way, capacitance $C_{332}$ is selected such that the sum of the gate-to-source capacitance $C_{311}$ plus capacitance $C_{332}$ is equal to the gate-to-source capacitance $C_{312}$. As a result, input delay element 330 operates as a symmetric delay line.

When enabled, amplifier subsections 311 and 312 provide corresponding output signals $RF_3$ and $RF_4$ in response to the corresponding input signals $RF_1$ and $RF_2$. The amplified output signal $RF_4$ is provided directly to intermediate output node 303. In contrast, the amplified output signal $RF_3$ is routed to intermediate output node 303 through impedance inverter delay element 340. The RF signal provided by impedance inverter delay element 340 is labeled as output signal $RF_5$. Impedance inverter delay element 340 is designed such that the delay introduced by impedance inverter delay element 340 is equal to the delay introduced by input delay element 330. These matched delays cause the amplified output signal $RF_4$ to be in phase with the amplified output signal $RF_5$. Because the $RF_4$ and $RF_5$ output signals are in phase, these signals are combined (i.e., added) at intermediate output node 303, thereby resulting in an amplified RF output signal $RF_{out}$. The $RF_{out}$ signal is provided at output terminal 302. The characteristic impedance of the impedance inverter delay element 340 is set to provide uniform loading of FET cells in amplifier subsection 311, as in amplifier subsection 312. In one embodiment, the $RF_{out}$ signal drives an antenna as a load. In this embodiment, an output impedance match circuit (not shown), which is designed to match the impedance associated with the antenna, is coupled to output terminal 302. Note that there is also typically a duplexer or filter block between the output terminal 302 of power amplifier circuit 300 and the antenna.

In accordance with the described embodiment, power amplifier circuit 300 is capable of operating in a low power mode or a high power mode. Amplifier subsection 311 is enabled (and amplifier subsection 312 is disabled) in the low power mode, while amplifier subsections 311 and 312 are both enabled in the high power mode.

Amplifier subsections 311 and 312 are enabled and disabled in response to a LO/HI# control signal, which is provided by a control logic unit (not shown). The LO/HI# signal is provided to bias control circuit 315. In response, bias control circuit 315 generates DC bias signals, $BIAS_1$ and $BIAS_2$. The $BIAS_1$ signal is applied to the gate(s) of amplifier subsection 311 via resistor 320. Capacitor 351 prevents the $BIAS_1$ signal from being transmitted to internal node 304. The $BIAS_2$ signal is applied to the gate(s) of amplifier subsection 312 via resistors 321 and 322. Note that the $BIAS_2$ signal is also applied to capacitor 352 at node 306. However, capacitor 352 is a relatively large capacitor (e.g., 50 pF) that operates as an AC short circuit to ground and a DC open circuit. Thus, capacitor 352 allows the $BIAS_2$ signal to be transmitted to internal node 304. Many acceptable bias is implemented by one or more field effect transistors, although other switching devices could be used. For example, shunt switch 313 can be implemented by one or control and control logic unit topologies exist, such that the design of these circuits will be routine in view of this disclosure.

The control signal LO/HI# is also applied to the gate of shunt switch 313. In the described embodiments, shunt switch 313 more enhancement mode pHEMT field effect transistors.

The LO/HI# signal is activated to a logic high state to implement the low power mode. Bias control circuit 315 activates the $BIAS_1$ signal to a logic high state in response to the activated LO/HI# signal, thereby enabling low power amplifier subsection 311. That is, the logic high $BIAS_1$ signal turns on the field effect transistors in amplifier subsection 311. Capacitor 351 ensures that the activated $BIAS_1$ voltage does not raise the voltage at the gate(s) of high power amplifier subsection 312.

In addition, bias control circuit 315 deactivates the $BIAS_2$ signal to a logic low state in response to the activated LO/HI# signal. The logic low $BIAS_2$ signal does not raise the voltage applied to the gate(s) of high power amplifier subsection 312. The logic high state of the activated LO/HI# signal also causes shunt switch 313 to turn on, thereby coupling internal node 305 to ground. When turned on, shunt switch 313 operates as an AC and DC short circuit. It should be noted that this is sufficient to shut off the bias of amplifier subsection 312. The deactivation of the $BIAS_2$ signal, as described, is a feature of one embodiment of the present invention. As a result, internal node 304 is maintained at a voltage low enough to prevent high power amplifier subsection 312 from turning on inadvertently. That is, high power amplifier subsection 312 is not inadvertently turned on in response to the $RF_{IN}$ signal. The resistance of resistor 321 is selected to provide the desired loading for the $RF_{IN}$ signal during the low power mode, such that the $RF_{IN}$ signal is provided to the enabled low power amplifier subsection 311 as the $RF_1$ signal with a very low loss. In an alternate embodiment, resistor 321 can be eliminated.

Because high power amplifier subsection 312 is turned off, input delay element 330 and amplifier subsection 312 are effectively removed from the signal path in the low power mode. Thus, in the low power mode, the $RF_{IN}$ signal is routed through capacitor 351 (as the $RF_1$ signal), amplifier subsection 311 (as the $RF_3$ signal), and impedance inverter delay element 340 (as the $RF_5$ signal) to output terminal 302 (as the $RF_{out}$ signal). Impedance inverter delay element 340 is designed to provide good impedance matching for the load attached to the output terminal 302 during the low power mode.

The LO/HI# control signal is deactivated to a logic low state to implement the high power mode. Bias control circuit 315 activates the $BIAS_1$ signal to a logic high state in response to the deactivated LO/HI# signal, thereby enabling low power amplifier subsection 311 in the manner described above in connection with the low power mode. Bias control circuit 315 also activates the $BIAS_2$ signal to a logic high state in response to the deactivated LO/HI# signal. The logic low state of the LO/HI# signal causes shunt switch 313 to turn off. When turned off, shunt switch 313 operates as an AC and DC open circuit. Under these conditions, the activated $BIAS_2$ signal is effectively applied to the gate(s) of high power amplifier subsection 312 via resistors 321 and 322, thereby enabling high power amplifier subsection 312. Note that capacitor 352 blocks DC signals (and passes AC signals), such that the activated BIAS$_2$ signal is not grounded in the high power mode.

The resistance of resistor 322 is selected such that the combined resistance of resistors 321 and 322 provide the desired loading for the RF$_{IN}$ signal and the delay line 330 during the high power mode. By selecting the resistances of resistors 321 and 322 in the above-described manner, the variation in the input load impedance between the low power mode and the high power mode is advantageously minimized. As a result, switched distributed power amplifier 300 does not require an input impedance matching circuit (e.g., input impedance matching circuit 220 of FIG. 2). Consequently, the design and layout area of switched distributed power amplifier 300 is improved with respect to the prior art.

As described above, input delay element 330 and amplifier subsection 312 are effectively inserted into the signal path of switched distributed power amplifier 300 in the high power mode. Input delay element 330 causes the RF$_2$ signal provided to high power amplifier subsection 312 to be delayed with respect to the RF$_1$ signal provided to low power amplifier subsection 311. Similarly, impedance inverting delay element 340 causes the RF$_5$ output signal provided by impedance inverting delay element 340 to be delayed with respect to the RF$_4$ output signal provided by high power amplifier subsection 312. The delays introduced by delay elements 330 and 340 are selected to ensure that the RF$_4$ and RF$_5$ output signals are in-phase. These in-phase output signals RF$_4$ and RF$_5$ are effectively added at intermediate node 303 to create the high power output signal RF$_{out}$.

Impedance inverting delay line 340 is designed to optimize the load impedance driven by amplifier subsections 311 and 312 during the high power mode. One manner in which this can be accomplished is described in U.S. patent application Ser. No. 10/666,552 by Thomas R. Apel & Tarun Juneja, filed Sep. 19, 2003, which is hereby incorporated by reference.

During both high and low power operation, the enabled amplifier subsections are fully biased to operate as linear amplifiers (e.g., deep class AB, approaching class B, linear amplifiers). Amplifier stage 310 therefore operates differently from a conventional Doherty amplifier in which the high power amplifier subsection is biased to operate as a non-linear amplifier.

The switched distributed power amplifier 300 of the present invention is particularly useful in linear power amplifier applications where power efficiency performance over a wide power band is important (for example, CDMA and WCDMA).

Although the invention has been described in connection with several embodiments, it is understood that this invention is not limited to the embodiments disclosed, but is capable of various modifications, which would be apparent to one of ordinary skill in the art. Thus, the invention is limited only by the following claims.

I claim:

1. A switched distributed power amplifier comprising:
   an input terminal configured to receive a radio frequency (RF) signal;
   an input delay element coupled to the input terminal;
   an amplifier stage comprising:
      a first amplifier subsection having one or more field effect transistors, each with a gate coupled to the input terminal; and
      a second amplifier subsection having one or more field effect transistors, each with a gate coupled to the input terminal through the input delay element;
      and a shunt switch coupled between each gate of the one or more field effect transistors in the second amplifier subsection and a reference voltage supply terminal; and
      an impedance inverting delay element coupled between an output of the first amplifier subsection and an output of the second amplifier subsection.

2. The switched distributed power amplifier of claim 1, wherein the reference voltage supply terminal is configured to receive a ground supply voltage.

3. The switched distributed power amplifier of claim 1, further comprising a control unit configured to activate the shunt switch in a low power mode, thereby connecting each gate of the one or more field effect transistors in the second amplifier subsection to the reference voltage supply terminal, and preventing the one or more field effect transistors in the second amplifier subsection from turning on when an RF signal is received on the input terminal.

4. The switched distributed power amplifier of claim 1, further comprising:
   a bias control circuit;
   a first resistor coupled between the bias control circuit and the gates of the one or more field effect transistors of the first amplifier subsection; and
   a second resistor having a first terminal coupled to the bias control circuit and a second terminal coupled to the gates of the one or more field effect transistors of the second amplifier subsection.

5. The switched distributed power amplifier of claim 4, further comprising a third resistor having a first terminal coupled to the second terminal of the second resistor, and a second terminal coupled to the gates of the one or more field effect transistors of the second amplifier subsection.

6. The switched distributed power amplifier of claim 5, wherein second resistor, third resistor and shunt switch are all coupled to a common node.

7. The switched distributed power amplifier of claim 6, further comprising a capacitor coupled between the first terminal of the second resistor and the reference voltage supply terminal.

8. The switched distributed power amplifier of claim 1, wherein the input delay element comprises:
   an inductor having a first terminal coupled to the input terminal and each gate of the one or more field effect transistors of the first amplifier subsection, and a second terminal coupled to each gate of the one or more field effect transistors of the second amplifier subsection;
   a first capacitance associated with the gates of the one or more field effect transistors in the first amplifier subsection; a second capacitance associated with the gates of the one or more field effect transistors in the second amplifier subsection; and
   a capacitor coupled to the first terminal of the inductor, the capacitor having a third capacitance.

9. The switched distributed power amplifier of claim 8, wherein the second capacitance is equal to the first capacitance plus the third capacitance.

10. The switched distributed power amplifier of claim 1, wherein the input delay element comprises:
    a first capacitance associated with the gates of the one or more field effect transistors in the first amplifier subsection; and a second capacitance associated with the gates of the one or more field effect transistors in the second amplifier subsection.

11. The switched distributed power amplifier of claim 1, further comprising a first direct current (DC) blocking capacitor coupled between the input delay element and each gate of the one or more field effect transistors in the first amplifier subsection.

12. The switched distributed power amplifier of claim 11, further comprising a second DC blocking capacitor coupled between the input terminal and the input delay element.

13. The switched distributed power amplifier of claim 11, further comprising a second DC blocking capacitor coupled between each gate of the one or more field effect transistors in the second amplifier subsection and the reference voltage supply terminal.

14. The switched distributed power amplifier of claim 1, further comprising an output terminal coupled to the output of the second amplifier subsection.

15. The switched distributed power amplifier of claim 1, wherein a delay introduced by the input delay element is equal to a delay introduced by the impedance inverting delay element.

16. The switched distributed power amplifier of claim 1, wherein the second amplifier subsection includes more field effect transistors than the first amplifier subsection.

17. The switched distributed power amplifier of claim 1, wherein each of the one or more field effect transistors in the first and second amplifier subsections comprises an enhancement mode pseudomorphic-high-electron-mobility transistor (pHEMT).

18. The switched distributed power amplifier of claim 1, wherein the shunt switch comprises one or more field effect transistors.

19. The switched distributed power amplifier of claim 18, wherein each of the one or more field effect transistors in the shunt switch comprises an enhancement mode pseudomorphic-high-electron-mobility transistor (pHEMT).

20. A method of implementing a switched distributed power amplifier comprising:
   applying a radio frequency (RF) input signal to gates of one or more field effect transistors in a first amplifier subsection;
   applying the RF input signal to a gates of one or more field effect transistors in a second amplifier subsection;
   providing an AC and DC path between ground and the gates of the one or more field effect transistors of the second amplifier subsection in a low power mode of the switched distributed power amplifier; and
   introducing an input delay to the RF input signal before the RF input signal is applied to the second amplifier subsection,
   wherein the input delay is introduced at least in part by a first capacitance introduced by the gates of the one or more field effect transistors of the first amplifier subsection, a second capacitance introduced by the gates of the one or more field effect transistors of the second amplifier subsection, and a third capacitance introduced by a capacitor coupled to the gates of the one or more field effect transistors of the first amplifier subsection.

21. The method of claim 20, further comprising selecting the sum of the first and third capacitances to be equal to the second capacitance.

22. The method of claim 20, further comprising providing a first resistance along the AC and DC path.

23. The method of claim 20, further comprising introducing an output delay between an output of the first amplifier subsection and an output terminal, wherein the output delay is selected to be equal to the input delay.

* * * * *